(12) United States Patent
Cox et al.

(10) Patent No.: US 10,423,877 B2
(45) Date of Patent: Sep. 24, 2019

(54) HIGH MEMORY BANDWIDTH NEUROMORPHIC COMPUTING SYSTEM

(71) Applicant: INTERNATIONAL BUSINESS MACHINES CORPORATION, Armonk, NY (US)

(72) Inventors: Charles E. Cox, San Jose, CA (US); Harald Huels, Horb am Neckar (DE); Arvind Kumar, Chappaqua, NY (US); Pritish Narayanan, San Jose, CA (US); Ahmet S. Ozcan, San Jose, CA (US); J. Campbell Scott, Los Gatos, CA (US); Winfried W. Wilcke, Los Altos Hills, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 617 days.

(21) Appl. No.: 15/237,459

(22) Filed: Aug. 15, 2016

(65) Prior Publication Data

US 2018/0046908 A1 Feb. 15, 2018

(51) Int. Cl.
*G06F 13/00* (2006.01)
*G06N 3/063* (2006.01)
*G06F 3/06* (2006.01)

(52) U.S. Cl.
CPC ............. *G06N 3/0635* (2013.01); *G06F 3/06* (2013.01); *G06F 13/00* (2013.01)

(58) Field of Classification Search
CPC .......... G06F 13/00; G06F 3/06; H06N 3/0635
See application file for complete search history.

(56) References Cited

U.S. PATENT DOCUMENTS

| | | |
|---|---|---|
| 5,627,923 A | 5/1997 | Kakizaki |
| 6,392,296 B1 | 5/2002 | Ahn et al. |
| 6,819,813 B2 | 11/2004 | Howland et al. |
| 7,727,806 B2 | 6/2010 | Uhland et al. |
| 8,273,603 B2 | 9/2012 | Racz et al. |
| 8,373,440 B2 | 2/2013 | Strukov et al. |
| 8,831,437 B2 | 9/2014 | Dobbelaere et al. |
| 2018/0007796 A1* | 1/2018 | Browne ................ H05K 3/34 |
| 2018/0024935 A1* | 1/2018 | Meswani ............ G06F 12/0893 |
| | | 711/145 |

OTHER PUBLICATIONS

Lin, et al., "Prototype of Multi-Stacked Memory Wafers Using Low-Temperature Oxide Bonding and Ultra-Fine-Dimension Copper Through-Silicon Via Interconnects", IEEE, Oct. 2014, 3 pages.
(Continued)

*Primary Examiner* — Errol V Fernandes
(74) *Attorney, Agent, or Firm* — Tutunjian & Bitetto, P.C.; Vazken Alexanian

(57) ABSTRACT

Three-dimensional (3D) neuromorphic computing systems are provided. A system includes a logic wafer having a plurality of processors. The system further includes a double-sided interposer bonded to the logic wafer and incorporating a signal port ring for sending and receiving signals. The system also includes a plurality of 3D memory modules bonded to the double-sided interposer. The double-sided interposer is a wafer scale or a panel scale providing communication between the plurality of processors and the plurality of 3D memory modules.

20 Claims, 11 Drawing Sheets

(56) References Cited

OTHER PUBLICATIONS

Lee et al., "Three-Dimensional Hybrid Integration Technology of CMOS, MEMS, and Photonics Circuits for Optoelectronic Heterogeneous Integrated Systems", IEEE Transactions on Electron Devics, pp. 748-754, vol. 58, No. 3, Mar. 2011.
Koyanagi, et al., "Neuromorphic Vision Chip Fabricated Using Three-Dimensional Integration Technology", IEEE International Solid-State Circuits Conference, Feb. 2011, 3 pages.

* cited by examiner

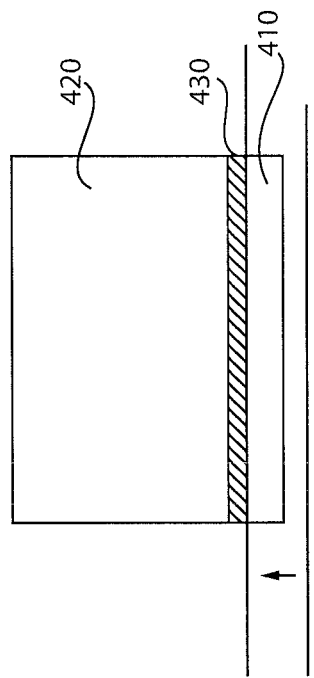
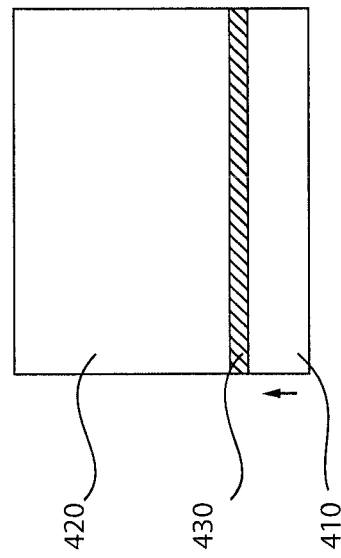

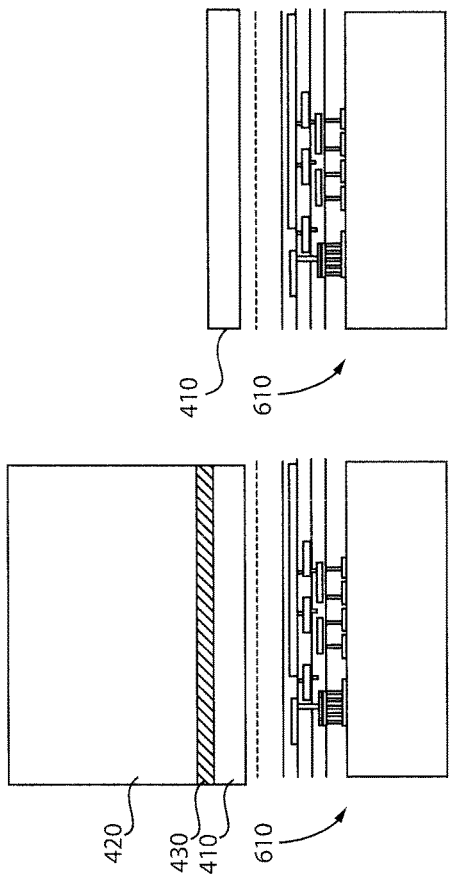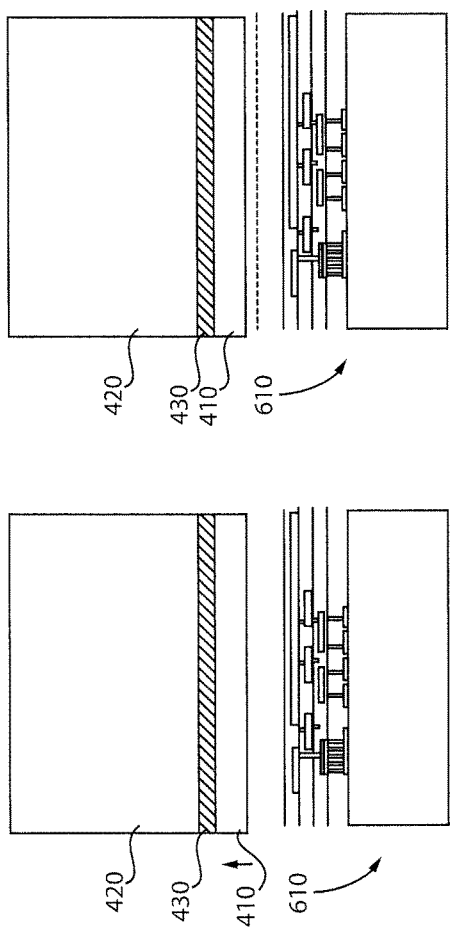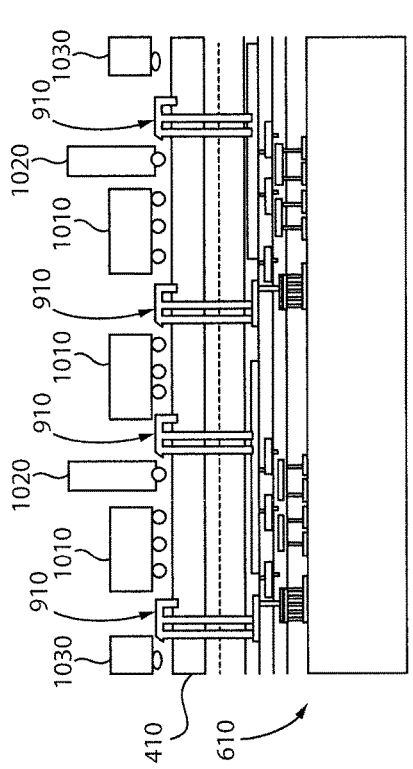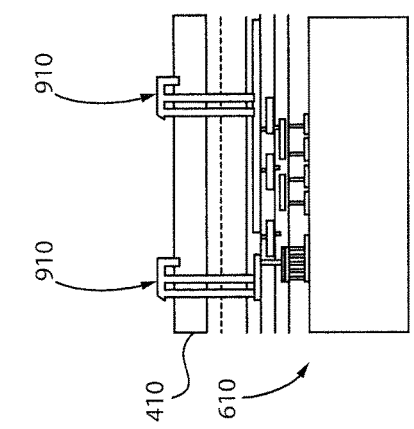

HIGH MEMORY BANDWIDTH NEUROMORPHIC COMPUTING SYSTEM

BACKGROUND

Technical Field

The present invention relates generally to computing systems and, in particular, to a high memory bandwidth neuromorphic computing system.

Description of the Related Art

Prior art neuromorphic computing platforms have been implemented based on analog chips that simulate spiking neurons. However, such systems suffer from deficiencies including, but not limited to, lack of flexibility.

SUMMARY

According to an aspect of the present principles, a three-dimensional (3D) neuromorphic computing system is provided. The system includes a logic wafer having a plurality of processors. The system further includes a double-sided interposer bonded to the logic wafer and incorporating a signal port ring for sending and receiving signals. The system also includes a plurality of 3D memory modules bonded to the double-sided interposer. The double-sided interposer is a wafer scale or a panel scale providing communication between the plurality of processors and the plurality of 3D memory modules.

According to another aspect of the present principles, a three-dimensional (3D) neuromorphic computing system is provided. The system includes a logic wafer having a plurality of fully integrated voltage regulators and a plurality of processors. The system further includes a double-sided interposer panel bonded to the logic wafer and incorporating a signal port region for sending and receiving signals. The system also includes a plurality of 3D memory modules bonded to the double-sided interposer panel. The system additionally includes a plurality of power modules disposed amongst the plurality of 3D memory modules and connected to the plurality of fully integrated voltage regulators. The double-sided interposer panel provides communication between the plurality of processors and the plurality of 3D memory modules. The logic wafer is substantially circular in shape and the double-sided interposer panel is substantially rectangular in shape and has a non-overlapping portion with respect to the logic wafer for incorporating at least a portion of the signal port region.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 4 graphically shows an exemplary result of step 305 of the method of FIG. 3, in accordance with an embodiment of the present principles;

FIG. 5 graphically shows an exemplary result of step 310 of the method of FIG. 3, in accordance with an embodiment of the present principles;

FIG. 6 graphically shows an exemplary preparation for step 315 of the method of FIG. 3, in accordance with an embodiment of the present principles;

FIG. 7 graphically shows an exemplary result of step 320 of the method of FIG. 3, in accordance with an embodiment of the present principles;

FIG. 8 graphically shows an exemplary result of step 325 of the method of FIG. 3, in accordance with an embodiment of the present principles;

FIG. 9 graphically shows an exemplary result of step 330 of the method of FIG. 3, in accordance with an embodiment of the present principles;

FIG. 10 graphically shows exemplary connections resulting from step 335 of the method of FIG. 3, in accordance with an embodiment of the present principles;

DETAILED DESCRIPTION OF PREFERRED EMBODIMENTS

The present principles are directed to a high memory bandwidth neuromorphic computing system. Advantageously, the present principles provide a flexible computing platform over conventional neuromorphic computing systems that mimics the basic principles of the neocortex.

In an embodiment, the present principles provide a 300 mm (or other size, as appreciated by one of ordinary skill in the art) wafer-scale system that utilizes three-dimensional (3D) integration for high-memory bandwidth and flexible scalability.

The wafer scale system is inspired by the connectivity of the brain. Neurons and synaptic connections are defined in software as address spaces. For example, if each connection is represented by several bytes in memory, then the system would be capable to simulate billion neurons with 500 synaptic connections, per neuron based on ~4-5 TB memory capacity target.

In an embodiment, an exemplary architecture of a wafer scale system in accordance with the present principles includes many processors (on the order of thousands) with specific communication logic, interconnected to each other on a 300 mm (or other size) wafer scale. On top of the logic wafer, a wafer size, double-sided interposer can be bonded which provides communication access to memory chips which are distributed throughout the interposer surface. The interposer also includes connections for power and Input/Output (I/O) signals.

Each of multiple memory modules can be a 3D-stacked high density DRAM product. The memory modules are bonded onto the interposer.

Power is delivered to the wafer scale system (e.g., logic chips and memory) from the top, through mini-power modules (voltage step-down) which are distributed on the interposer, in-between the memory modules.

In an embodiment, cooling of the wafer scale system is achieved through fluid immersion. In the same or other embodiments, heat sinks can be used at the bottom of the wafer as well as on the individual memory modules which may utilize micro-channel cooling.

Figure 1:
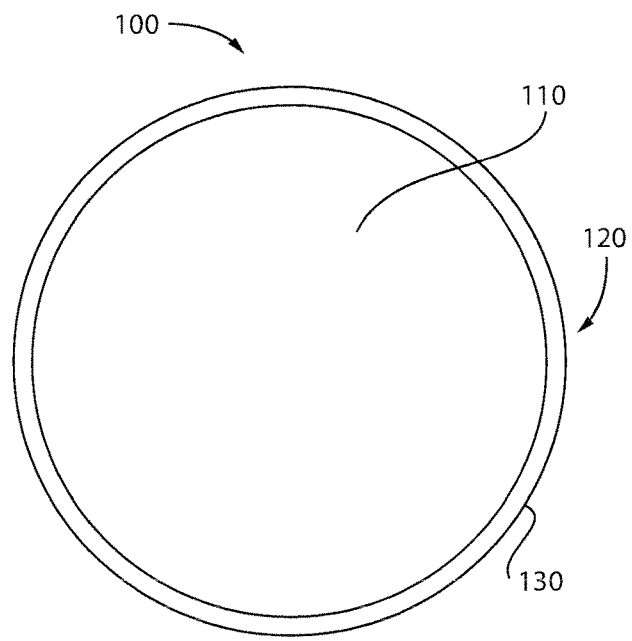
FIG. 1 shows an exemplary circular interposer arrangement, in accordance with an embodiment of the present principles.

FIG. 1 shows an exemplary circular interposer arrangement 100, in accordance with an embodiment of the present principles. The wafer scale interposer arrangement 100 includes a logic wafer 110 bonded to a wafer scale, double-sided interposer (hereinafter "interposer wafer" or "interposer" in short) 120. The logic wafer 110 and the interposer 120 are substantially circular.

The outer edge of the interposer 120 (e.g., 5 mm (or some other distance) from the outer edge) will include a ring of input/output communication ports (interchangeably referred to herein as an "I/O ring") 130.

The interposer 120 can have, for example, a 300 mm or 450 mm diameter, or some other size, depending upon the implementation. The interposer 120 can be made from, but not limited to, Si, glass or a flexible material. The preceding materials are merely illustrative and, thus, other materials can also be used, as readily appreciated by one of ordinary skill in the art.

The interposer 120 can include active components such as optical interconnects at the I/O ring 130 for fast communication between similar wafer-scale systems and/or to the external world (e.g., sensor data input, external mainframe, and so forth). Fiber optic cables can be used to connect to the system through these interconnects.

The interposer 120 can also include MEMS/NEMS (micro or nano electro-mechanical switches) for power island control (e.g., shutting down power to certain regions).

The interposer 120 can be bonded (e.g., using oxide bonding) to the logic wafer 110 on one side and metallic micro bumps (e.g. Cu) can be used on the other side for bonding memory chips, power regulators, and so forth.

In an embodiment, an interposer arrangement can includes a 450 mm wafer scale interposer bonded on a 300 mm logic wafer. The larger size interposer aids in increasing the total system memory (more DRAM can be bonded on top). These and other variations of the present principles are readily determined by one of ordinary skill in the art given the teachings of the present principles provided herein, while maintaining the spirit of the present principles.

Figure 2:
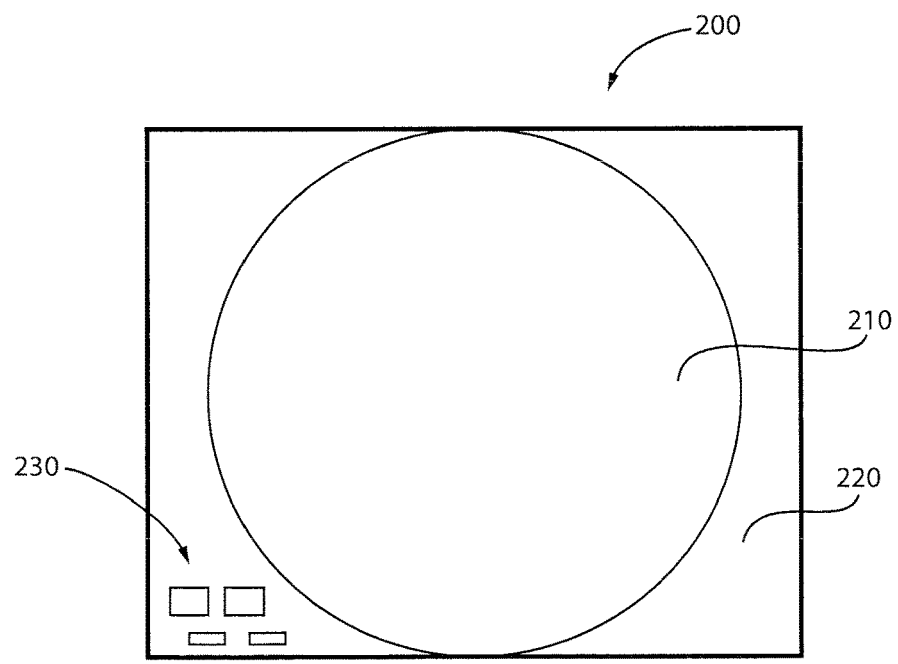
FIG. 2 shows an exemplary rectangular interposer arrangement, in accordance with an embodiment of the present principles.

FIG. 2 shows an exemplary rectangular interposer arrangement 200, in accordance with an embodiment of the present principles. In FIG. 2, the interposer 220 is a rectangular "panel" scale (e.g., 300×400 mm, noting that other sizes can be used, depending upon the implementation), utilizing flat panel manufacturing techniques.

A logic wafer 210 is bonded to the interposer 220. In the embodiment of FIG. 2, the logic wafer 210 is substantially circular (of course, other shapes, including rectangular can also be used). The logic wafer 210 is surrounded by an external area 220A of the interposer 220. The external area 220A can be used for peripheral components 230. Such peripheral components 230 can include, but are not limited to, for example, power regulators, optical interconnects, and so forth.

The interposers shown and described herein can be obtained from a foundry, and can be provided unthinned or pre-thinned and attached to a temporary carrier (using a temporary adhesive). The interposers can be thinned using known grinding and/or etching techniques.

Figure 3:
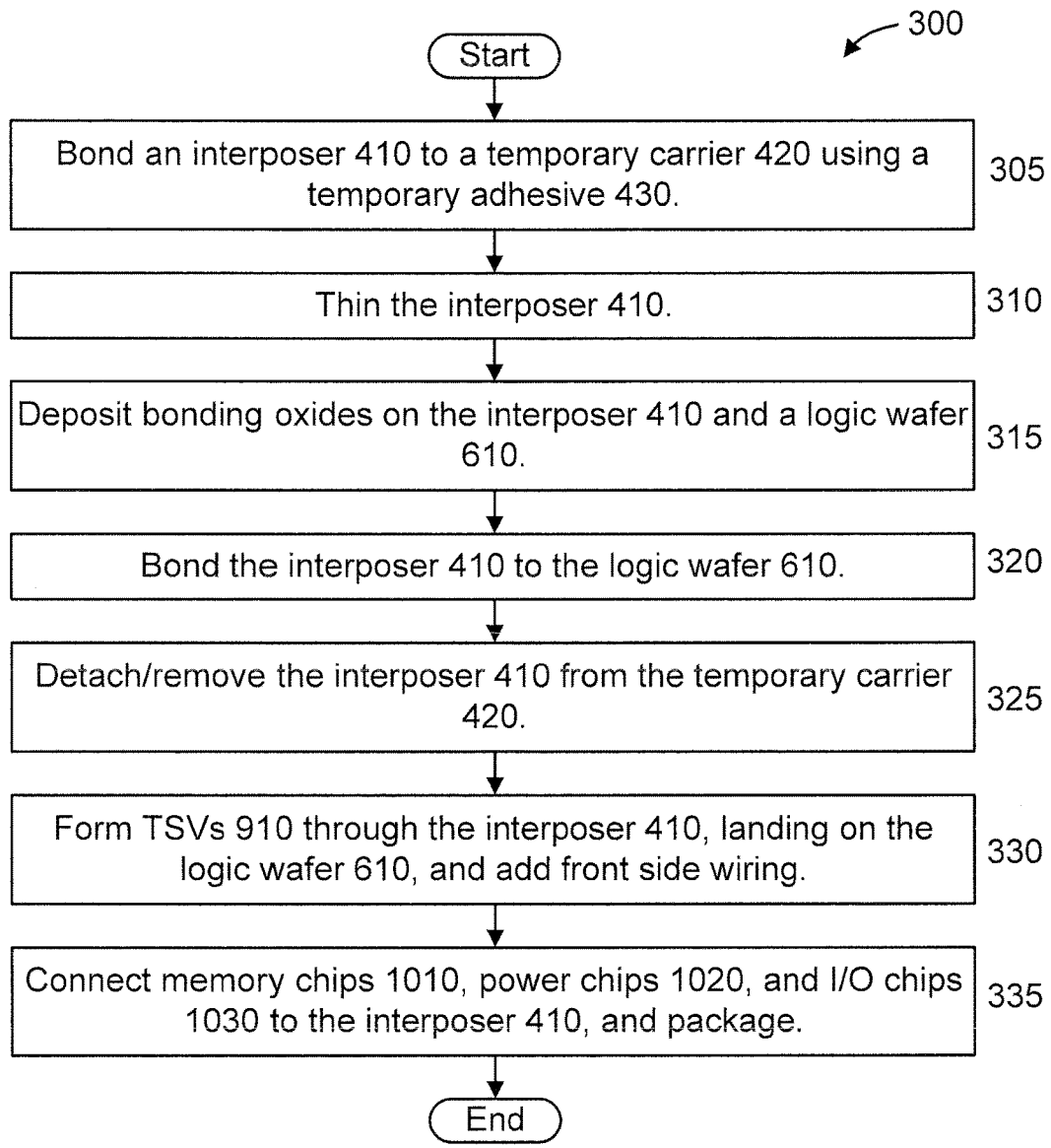
FIG. 3 shows an exemplary method for interposer-logic wafer bonding, in accordance with an embodiment of the present principles.

FIG. 3 shows an exemplary method 300 for interposer-logic wafer bonding, in accordance with an embodiment of the present principles. Method 300 will also be shown graphically in FIGS. 4-10.

At step 305, bond an interposer 410 to a temporary carrier 420 using a temporary adhesive 430. In another embodiment, the interposer 410 can be received from a foundry already bonded to the temporary carrier 420. FIG. 4 graphically shows an exemplary result of step 305 of method 300 of FIG. 3, in accordance with an embodiment of the present principles.

At step 310, thin the interposer 410. For example, the interposer 410 can be thinned using known grinding and etching techniques. FIG. 5 graphically shows an exemplary result of step 310 of method 300 of FIG. 3, in accordance with an embodiment of the present principles.

At step 315, deposit bonding oxides on the interposer 410 and a logic wafer 610. The logic wafer 610 can be obtained from the foundry. FIG. 6 graphically shows an exemplary preparation for step 315 of method 300 of FIG. 3, in accordance with an embodiment of the present principles.

At step 320, bond the interposer 410 to the logic wafer 610. FIG. 7 graphically shows an exemplary result of step 320 of method 300 of FIG. 3, in accordance with an embodiment of the present principles.

At step 325, detach/remove the interposer 410 from the temporary carrier 420. FIG. 8 graphically shows an exemplary result of step 325 of method 300 of FIG. 3, in accordance with an embodiment of the present principles.

At step 330, form TSVs 910 through the interposer 410, landing on the logic wafer 610, and add front side wiring. FIG. 9 graphically shows an exemplary result of step 330 of method 300 of FIG. 3, in accordance with an embodiment of the present principles.

At step 335, connect memory chips (e.g., High Bandwith Memories (HBMs)) 1010, power chips 1020, and I/O chips 1030 to the interposer 410, and package. FIG. 10 graphically shows exemplary connections resulting from step 335 of method 300 of FIG. 3, in accordance with an embodiment of the present principles.

Figure 11:
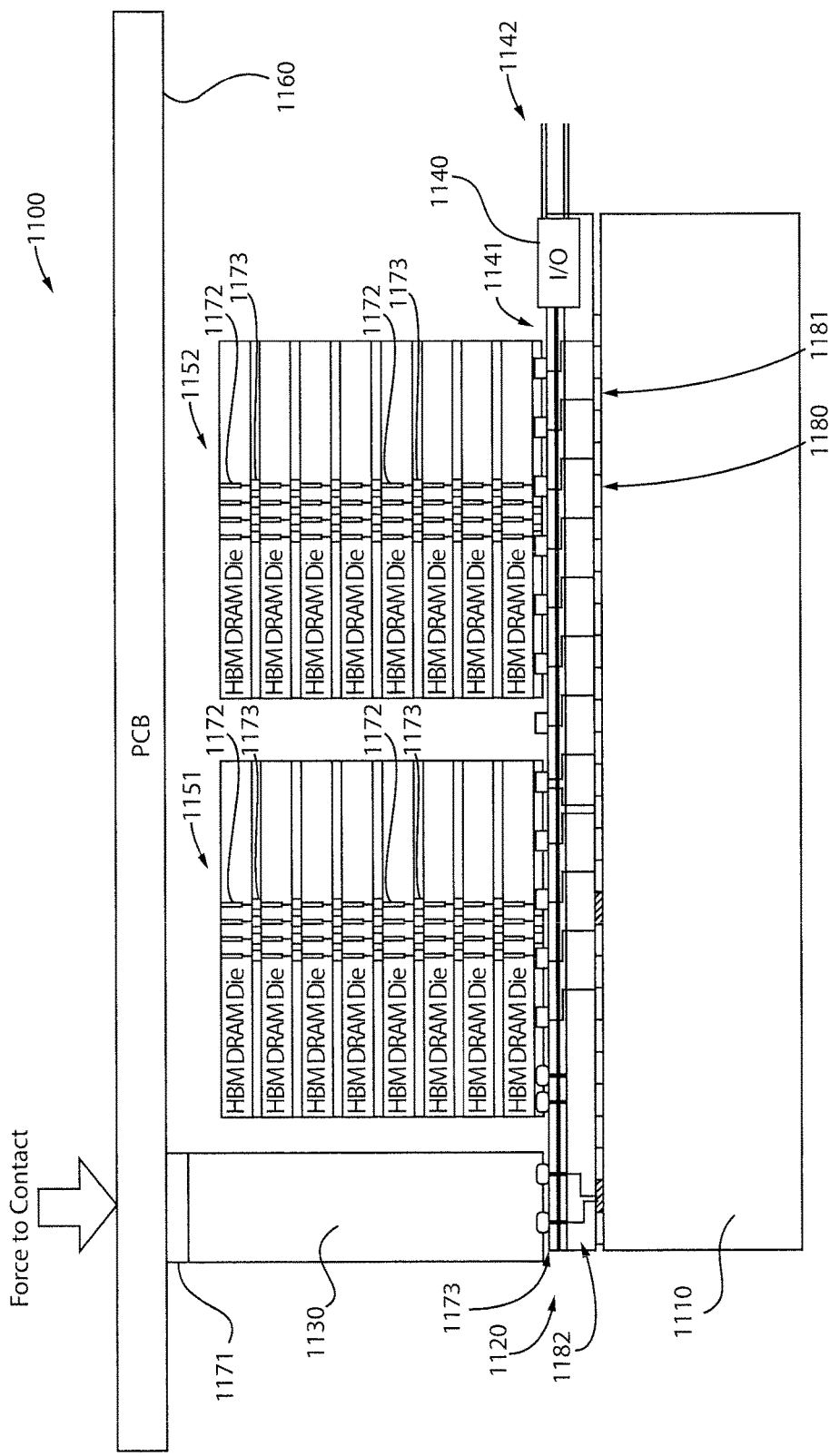
FIG. 11 shows an exemplary cross-sectional view of an implementation of the wafer scale system with power distribution, in accordance with an embodiment of the present principles.

FIG. 11 shows an exemplary cross-sectional view of an implementation of the wafer scale system 1100 with power distribution, in accordance with an embodiment of the present principles.

The wafer scale system 1100 incudes a logic wafer 1110, an interposer layer (or "interposer") in short 1120, a power chip (or power module) 1130, an I/O chip 1140, IO lines 1141, fibers 1142, two memory modules 1151, 1152, a printed circuit board (PCB) 1160, non-TSV connectors 1171, TSV's 1172, processors 1180, communication logic 1181, and fully integrated voltage regulators (FIVRs) 1182).

The non-TSV connectors 1171 can be, for example, but are not limited to, elastomeric connectors or other LGA type connectors.

The fibers 1142 are connected to the I/O lines 1141 on one end and to other systems/components/etc. at the other end. Such other systems can include, but are not limited to, other wafer scale systems, depending upon the implementation.

Each of the memory modules 1151, 1152 is a 3D-stacked high density DRAM product. In the embodiment of FIG. 11, each of the memory modules 1151, 1152 is an 8GB DRAM stack. Of course, other memory sizes and numbers of stacks can be used, depending upon the implementation. In an embodiment, each of the memory modules can be, but is not limited to, a High Bandwith Memory (HBM) such as a Hynix® HBM. Each of the memory modules (two 8GB DRAM stacks) 1151, 1152 are interconnected using TSV's 1172 and microbumps 1173.

In the embodiment of FIG. 11, the PCB 1160 is connected to the power chip 1130 using a force-to-contact approach. Of course, other types of connections can also be used, while maintaining the spirit of the present principles.

The power chip 1130, and each of the 8GB DRAM stacks 1151, 1152 are connected to the interposer 1120 using microbumps 1173.

The interposer 1120 provides a short distance link between the memories 1151, 1152 and the processors 1180 as well as local power delivery to the preceding via the power chip 1130. The power chip (regulator) needs to be connected to the overall power control to be able to insulate 'reticles' from the power subsystem in case of a local defect or error. The interposer 1120 also allows system level I/O, and the flexibility to incorporate active components (lasers, optical interconnects, and so forth) that are physically close to the processors 1180.

The interposer 1120 also helps to spread heat laterally generated by the cores of the processors 1180. Under typical operating conditions, we expect active regions (e.g., several processors and memory) which generate more heat to be surrounded by inactive (or less active, e.g., speed/power can be dynamically reduced) regions which are cooler. The interposer 1120 can help to spread the heat and prevent overheating the DRAM chips 1151, 1152 sitting on top of the interposer 1120.

In another embodiment, the system does not include an interposer wafer. Instead the metallization layers for connectivity are added onto the logic wafer as additional metal layers to provide connectivity between processors and memory chips. In this embodiment, memory chips are directly bonded on the logic wafer surface. Power delivery and I/O connections also applied directly onto the logic wafer and redistributed via the additional metal levels which replace the interposer.

Each of the processors 1180 can be connected to neighboring processors 1180 through back-end wiring on the chip. Intra-chip interconnects can also be added post processing by additional metallization layers.

Figure 12:
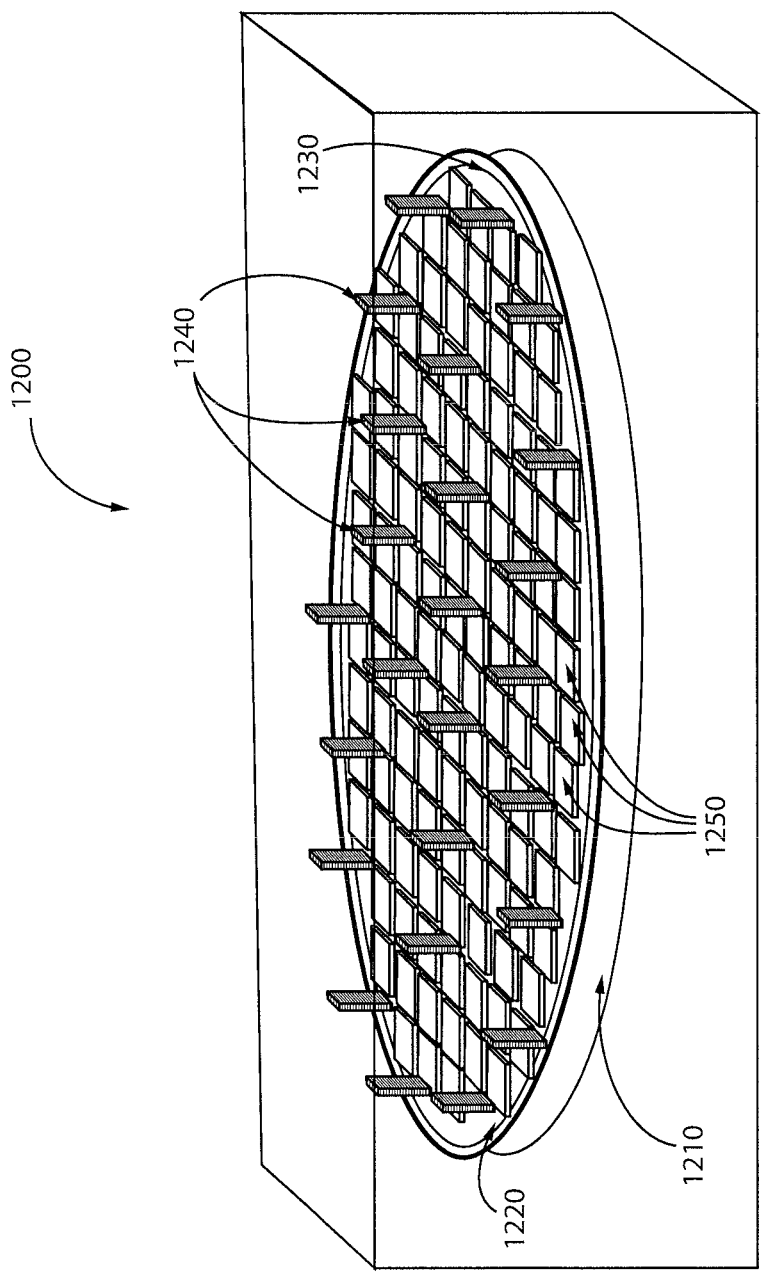
FIG. 12 shows an exemplary wafer scale system employed using liquid immersion cooling, in accordance with an embodiment of the present principles.

FIG. 12 shows an exemplary wafer scale system 1200 employed using liquid immersion cooling, in accordance with an embodiment of the present principles.

The wafer scale system 1200 includes a logic wafer 1210, an interposer 1220, an I/O ring 1230, mini-power modules (or "power modules" in short) 1240, memory modules (DRAM stacks) 1250, and liquid immersion cooling 1260.

Power is delivered to the wafer scale system (e.g., logic chips and memory) from the top, through the power modules 1240 (voltage step-down) which are distributed on the interposer 1220, in-between the memory modules 1250.

Figure 18:
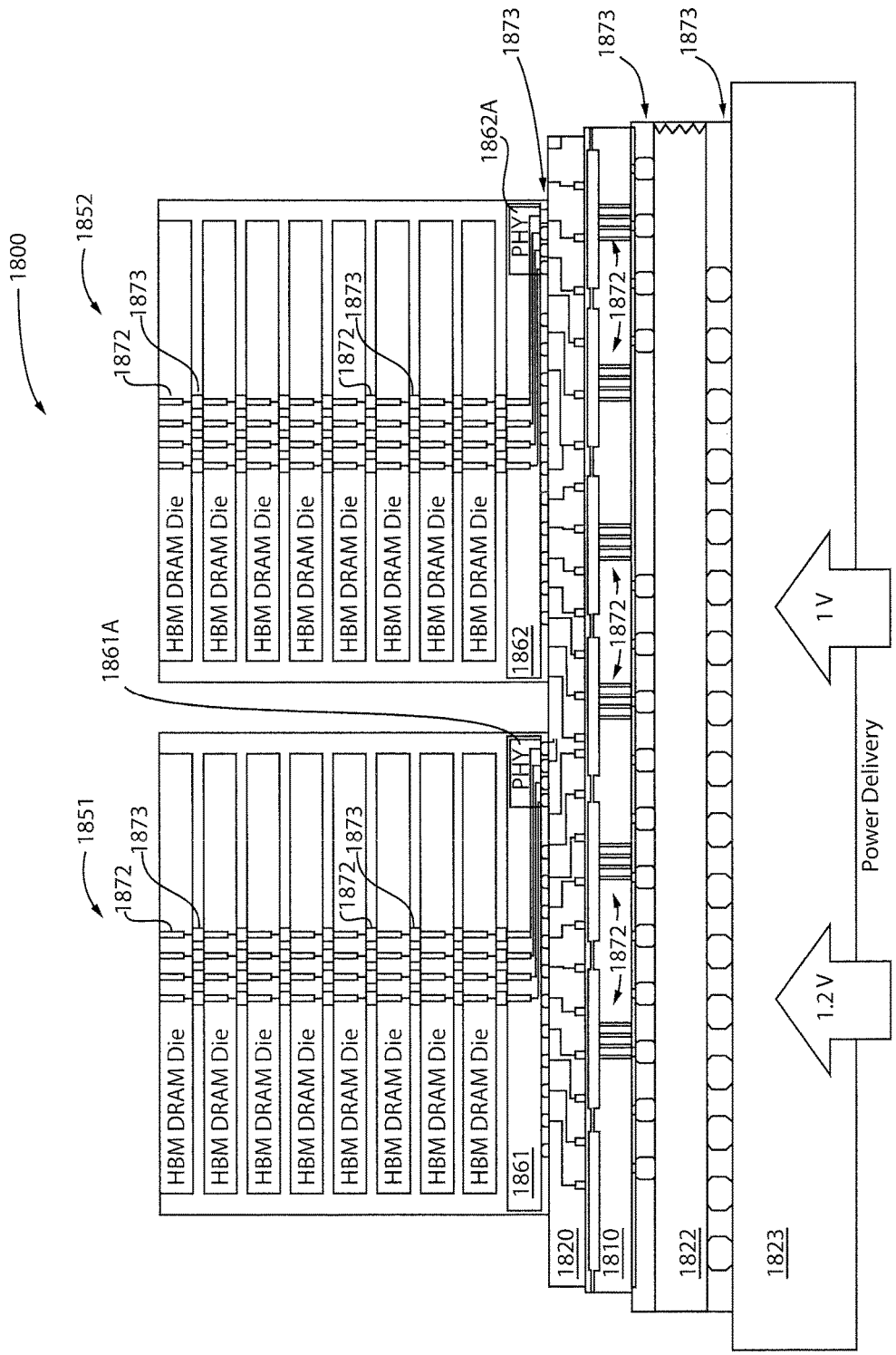
FIG. 18 shows an exemplary wafer scale system 1800 in which power is delivered to the system from the bottom of the logic wafer, in accordance with an embodiment of the present principles.

In an alternative embodiment power is delivered to the system from the bottom of the logic wafer (see FIG. 18).

In an embodiment, a wafer scale system can have the following target specifications: 4 TB of memory (e.g., 500 HBMs, each with 8GB); 12 CPUs per HBM, for a total of 8700 CPUs (with, e.g., up to 35,000 processor cores); 1 billion neurons, and 500 synapses; a power consumption of <16 W/cm2 (for, e.g., a total of <12 kW delivered through ~100 current converters). Of course, these target specifications can be readily varied depending upon the implementation, as readily appreciated by one of ordinary skill in the art.

A description will now be given regarding wafer scale integration.

Chip-to-chip communication requires "stitching" between reticles which overlaps reticles at higher back-end metallization levels. Stitching refers to electrical connections between reticles which can be between nearest neighbors and can also include long distance connections (e.g., every other reticle is connected).

In order to reduce the number of stitching steps, a large reticle with multi-processors can be designed which would have intra-chip communication built in the standard back-end wiring.

Figure 13:
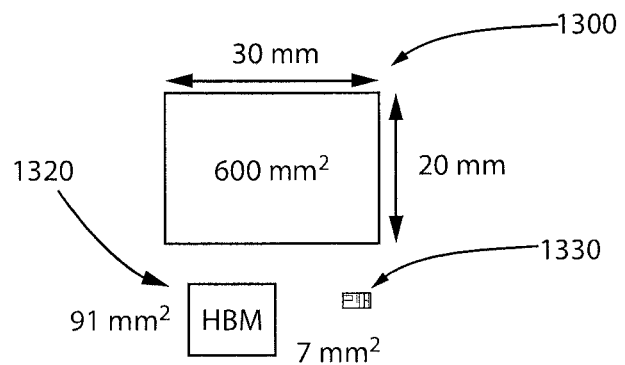
FIG. 13 shows an exemplary 600 mm2 reticle size chip, in accordance with an embodiment of the present principles.

FIG. 13 shows an exemplary 600 mm2 reticle size chip 1300, in accordance with an embodiment of the present principles. The following rough approximations are used for the sake of illustration. Other sizes and arrangements can also be used, given the teachings of the present principles provided herein, while maintaining the spirit of the present principles.

A multi-core ARM® A9 chip is on the order of few mm2 (~1.5 mm2 per core). The HBM memory 1320 chip size is ~91 mm2 (11.8×7.7 mm). Considering space for the communication logic in this example, we presume ~7 mm2 per processor 1330. This would result in 12 processors under each HBM memory 1320 and 85 processors in a 600 mm2 reticle.

Figure 14:
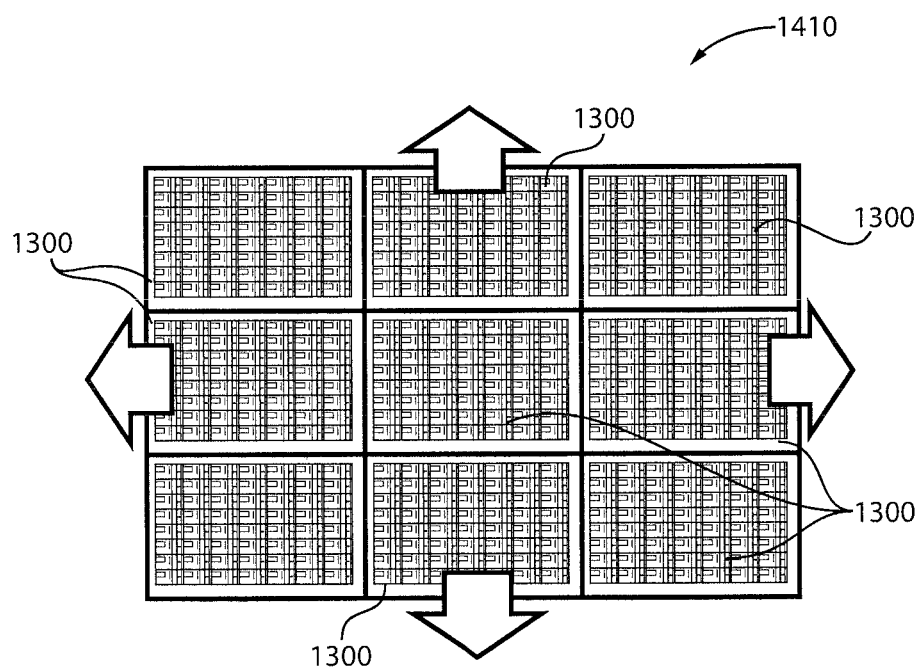
FIG. 14 shows exemplary intra-reticle communication at the interposer level, in accordance with an embodiment of the present principles.

FIG. 14 shows exemplary intra-reticle communication at the interposer level 1410, in accordance with an embodiment of the present principles. The intra-reticle communication can involve multiple reticles 1420.

A description will now be given regarding wafer scale integration.

The interposer wafer also needs stitching between the dies due to the limited lithography field size. Recent demands on 2.5D or 3D integration also drove lithographic stepper advances with an increased field of view. For example, 66×52 mm field of view steppers exist to produce large interposers without the need of stitching. Thus, one can design interposer dies that are 4 times the size of logic dies as illustrated below:

The interposer wafer can be bonded directly (e.g., using oxide bonding) to the logic wafer or through metal/solder bumps in between the two.

In an alternative embodiment, small (e.g. 24 cm2) interposers are bonded on the logic wafer, covering the whole wafer area.

Figure 15:
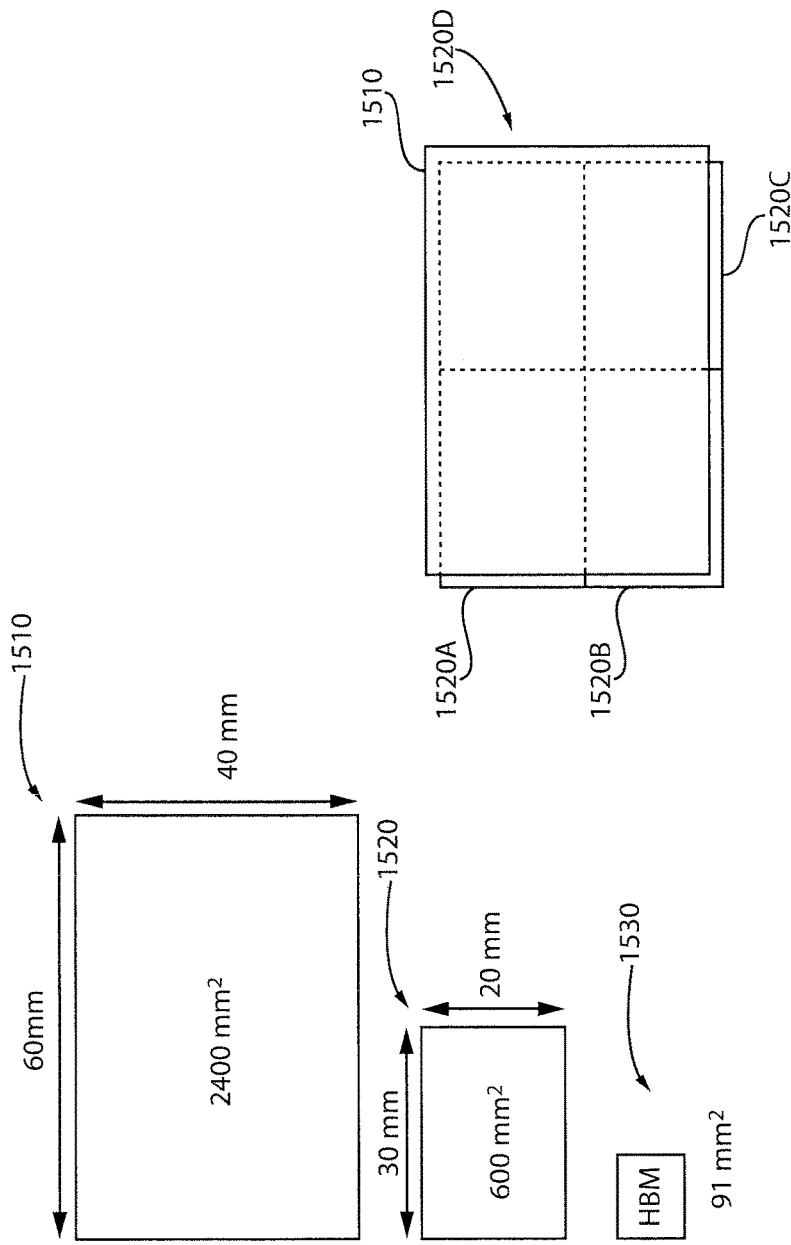
FIG. 15 shows a memory die, a logic die, and interposer die, and an interposer die on top of 4 logic dies, in accordance with an embodiment of the present principles.

FIG. 15 shows a memory die 1530, a logic die 1520, and interposer die 1510, and also the interposer die 1510 on top of 4 logic dies 1520A-D (28 HBMs, 340 CPUs), in accordance with an embodiment of the present principles. The memory die 1510 has an area of about 91 mm2, the logic die has an area of 20 mm×30 mm (600 mm2), and the interposer die 1530 has an area of 40 mm×60 mm (2400 mm2).

Figure 16:
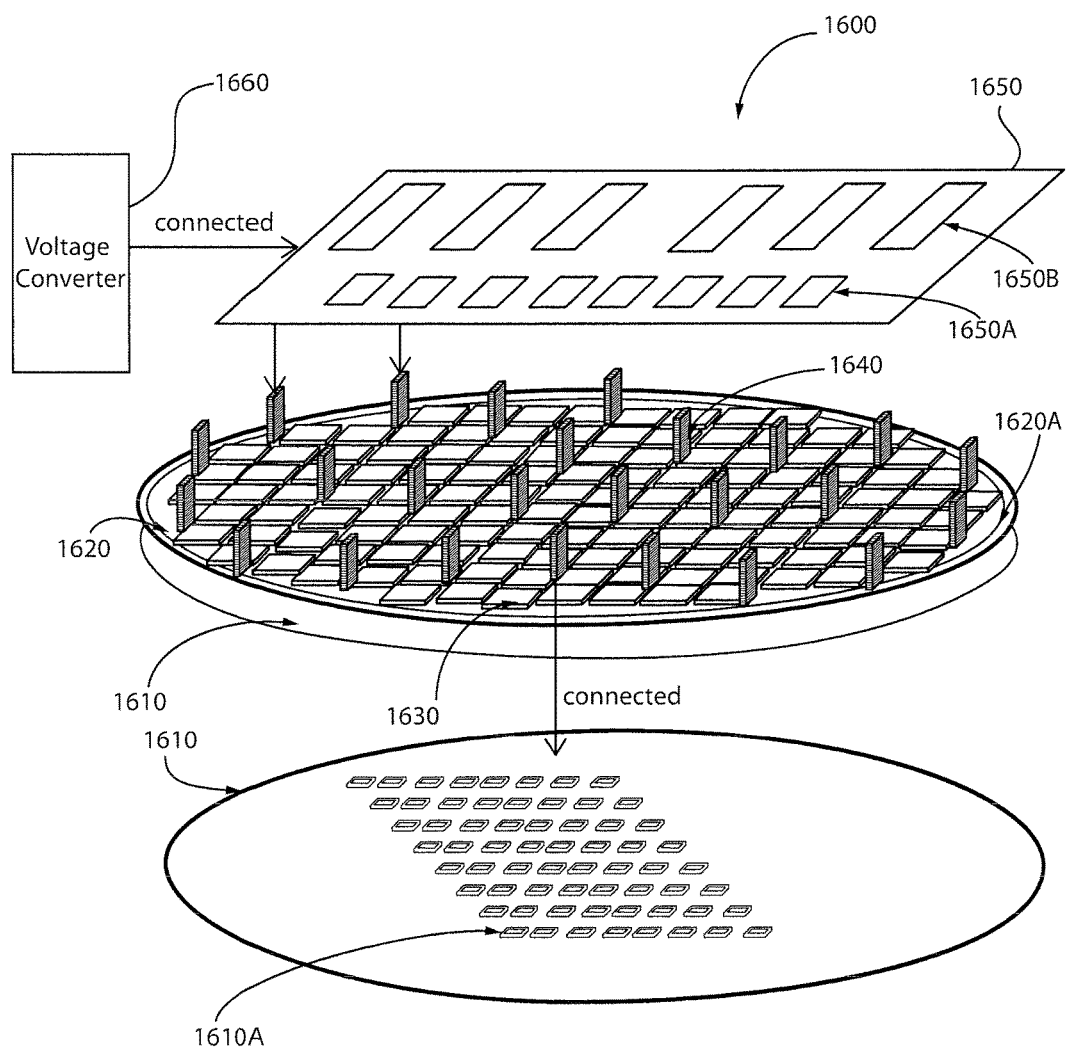
FIG. 16 shows an exemplary power distribution arrangement of a wafer scale system, in accordance with an embodiment of the present principles.

FIG. 16 shows an exemplary power distribution arrangement 1600 of a wafer scale system, in accordance with an embodiment of the present principles. The power distribution arrangement 1600 involves an interposer 1620 with a I/O ring 1620A, a logic wafer 1610 having a set of fully integrated voltage regulators (FIVRs) 1610A, DRAM stacks 1630, power modules 1640, a printed circuit board (PCB) 1650 for at least power distribution, and a voltage converter 1660. The PCB 1650 includes a set of a voltage regulation modules (VRMs) 1650A and a set of vents 1650B. The voltage converter 1660 is connected to the PCB 1650. The VRMs 1650A of the PCB 1650 are connected to the power modules 1640 that, in turn, are connected to the FIVRs 1610A.

A description will now be given regarding fully integrated voltage regulators (FIVRs) to which the present principles can be applied.

The FIVRs can use a common cell architecture with 20 cells.

The FIVR architecture can support a flat efficiency curve. The FIVR architecture can support fine grain power management (thus, allowing for multiple voltage rails).

The FIVR architecture can involve telemetry and margining features.

The FIVR architecture can involve active voltage positioning for current sharing and balance.

The FIVR architecture can include control features such as, but not limited to, Joint Test Action Group (JTAG) features, Field-Programmable Gate Array (FPGA) features, Test/BIST (Built-In Self-Test) features, and so forth.

The FIVR architecture can include an "E-Fuse" function to locally turn off voltage rails in case of a local defects or errors. The overall FIVR control unit will be part of the logic applied to the logic wafer.

Figure 17:
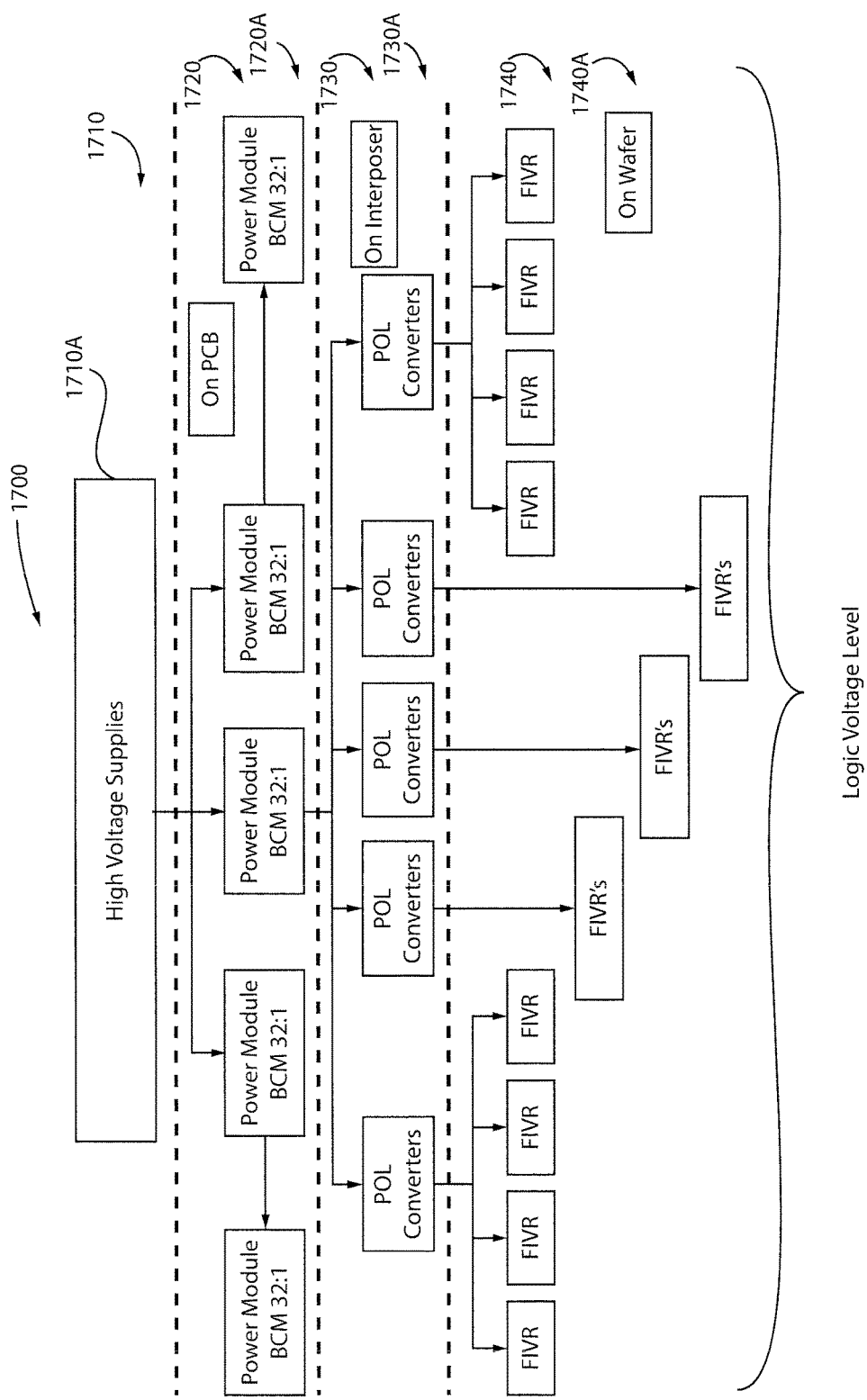
FIG. 17 shows an exemplary power level hierarchy of a wafer scale system, in accordance with an embodiment of the present principles.

FIG. 17 shows an exemplary power level hierarchy 1700 of a wafer scale system, in accordance with an embodiment of the present principles.

At a top level 1710, there are the high voltage supplies 1710A.

At a level 1720 (immediately below level 1710), corresponding to the PCB level, there are power modules 1720A.

At a level 1730 (immediately below level 1720), corresponding to the interposer level, there are Point Of Load (POL) converters 1730A.

At a level 1740 (immediately below level 1730), corresponding to the logic wafer level, there are FIVRs 1740A.

FIG. 18 shows an exemplary wafer scale system 1800 in which power is delivered to the system from the bottom of the logic wafer, in accordance with an embodiment of the present principles. Through silicon vias (TSVs) 1872 are manufactured during the logic wafer processing which carry power from the bottom to the processors 1880 and memories 1851, 1852 on the top side of the logic wafer 1810. The advantage of bottom power delivery is the direct vertical connection possibility to each of the processors 1880 and memories 1851, 1852 without the need for lateral power distribution that results in voltage drop due to resistance penalty. Therefore, this scheme also eliminates the need for integrated voltage regulators on the logic wafer 1810.

The wafer scale system 1800 incudes a logic wafer 1810, an interposer layer (or "interposer") in short 1820, a package substrate 1822, a printed circuit board (PCB) 1823, two memory modules 1851, 1852, TSV's 1872, and processors 1180.

Each of the memory modules 1851, 1852 is a 3D-stacked high density DRAM product. In the embodiment of FIG. 18, each of the memory modules 1851, 1852 is an 8GB DRAM stack. Of course, other memory sizes and numbers of stacks can be used, depending upon the implementation. In an embodiment, each of the memory modules can be, but is not limited to, a High Bandwith Memory (HBM) such as a Hynix® HBM. Each of the memory modules (two 8GB DRAM stacks) 1851, 1852 are interconnected using TSV's 1872 and microbumps 1873.

In the embodiment of FIG. 18, the PCB 1823 is connected to the package substrate 1822 using microbumps 1873, and the package substrate 1822 is connected to the logic wafer 1810 using microbumps 1873. The interposer 1820 is connected to logic dies 1861, 1862 that, in turn, are connected to each of the 8GB DRAM stacks 1851, 1852 using microbumps 1873. Logic die 1861 includes physical (PHY) layer interface 1861A, and logic die 1862 includes physical (PHY) layer interface 1862A.

The interposer 1820 provides a short distance link between the memories 1851, 1852 and the processors 1880. The interposer 1820 also allows system level I/O, and the flexibility to incorporate active components (lasers, optical interconnects, and so forth) that are physically close to the processors 1880.

The processors 1880 can be, for example, but are not limited to, ARM® CPUs.

Each of the processors 1880 can be connected to neighboring processors 1880 through back-end wiring on the chip. Intra-chip interconnects can also be added post processing by additional metallization layers.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A three-dimensional (3D) neuromorphic computing system, comprising:
    a logic wafer having a plurality of processors;
    a double-sided interposer bonded to the logic wafer, and incorporating a signal port ring for sending and receiving signals; and
    a plurality of 3D memory modules bonded to the double-sided interposer,
    wherein the double-sided interposer is a wafer scale or a panel scale providing communication between the plurality of processors and the plurality of 3D memory modules.

2. The 3D neuromorphic computing system of claim 1, wherein the double-sided interposer comprises Si or glass or a flexible material.

3. The 3D neuromorphic computing system of claim 1, wherein the double-sided interposer is formed into a rectangular shape.

4. The 3D neuromorphic computing system of claim 1, wherein the double-sided interposer comprises one or more switches for power island control selected from the group consisting of microelectromechanical switches and nanoelectromechanical switches.

5. The 3D neuromorphic computing system of claim 1, further comprising a plurality of power modules disposed amongst the plurality of 3D memory modules.

6. The 3D neuromorphic computing system of claim 5, wherein the logic wafer comprises a plurality of fully integrated voltage regulators for connecting to plurality of power modules.

7. The 3D neuromorphic computing system of claim 6, further comprising a printed circuit board for distributing power to the plurality of power modules.

8. The 3D neuromorphic computing system of claim 1, wherein the signal port ring comprises active components, the active components comprising optical interconnects.

9. The 3D neuromorphic computing system of claim 1, further comprising a fluid immersion system.

10. The 3D neuromorphic computing system of claim 1, wherein the signal port ring is incorporated into the double-sided interposer, adjacent a periphery of the double-sided interposer.

11. The 3D neuromorphic computing system of claim 1, wherein each of the logic wafer and the double-sided interposer have a substantially circular shape.

12. The 3D neuromorphic computing system of claim 1, wherein the logic wafer has a substantially circular shape and the double-sided interposer has a substantially rectangular shape with an non-overlapping portion with respect to the logic wafer, the non-overlapping portion comprising peripheral components.

13. The 3D neuromorphic computing system of claim 12, wherein the peripheral components are selected from the group consisting of power regulators and optical interconnects.

14. The 3D neuromorphic computing system of claim 12, wherein the double-sided interposer laterally spreads heat generated by the plurality of processors.

15. The 3D neuromorphic computing system of claim 1, wherein the signals sent and received by the signal port ring include power, data, and control signals.

16. The 3D neuromorphic computing system of claim 1, further comprising a printed circuit board for providing top-down power distribution to at least the plurality of processors of the logic wafer.

17. A three-dimensional (3D) neuromorphic computing system, comprising:
   a logic wafer having a plurality of fully integrated voltage regulators and a plurality of processors;
   a double-sided interposer panel bonded to the logic wafer, and incorporating a signal port region for sending and receiving signals;
   a plurality of 3D memory modules bonded to the double-sided interposer panel; and
   a plurality of power modules disposed amongst the plurality of 3D memory modules, and connected to the plurality of fully integrated voltage regulators,
   wherein the double-sided interposer panel provides communication between the plurality of processors and the plurality of 3D memory modules, and
   wherein the logic wafer is substantially circular in shape and the double-sided interposer panel is substantially rectangular in shape and has a non-overlapping portion with respect to the logic wafer for incorporating at least a portion of the signal port region.

18. The 3D neuromorphic computing system of claim 17, wherein the signal power region comprises optical interconnects.

19. The 3D neuromorphic computing system of claim 17, wherein the double-sided interposer comprises one or more switches for power island control selected from the group consisting of microelectromechanical switches and nano-electromechanical switches.

20. The 3D neuromorphic computing system of claim 17, further comprising a printed circuit board for providing top-down power distribution to at least the plurality of processors of the logic wafer.

* * * * *